United States Patent [19]
Steffan et al.

[11] Patent Number: 6,165,805
[45] Date of Patent: Dec. 26, 2000

[54] SCAN TOOL RECIPE SERVER

[75] Inventors: Paul J. Steffan, Elk Grove; Allen S. Yu, Fremont, both of Calif.

[73] Assignee: Advanced Micro Devices, Inc., Sunnyvale, Calif.

[21] Appl. No.: 09/182,942

[22] Filed: Oct. 29, 1998

[51] Int. Cl.[7] .............................. H01L 21/66; G01R 31/26
[52] U.S. Cl. ............................ 438/14; 438/16; 438/18; 700/95
[58] Field of Search ................... 438/14, 16, 15, 438/17, 18; 700/95

[56] References Cited

U.S. PATENT DOCUMENTS

| | | |
|---|---|---|
| 5,469,361 | 11/1995 | Moyne ........................................ 700/95 |
| 5,866,437 | 2/1999 | Chen et al. . |
| 5,926,690 | 7/1999 | Toprac et al. . |
| 5,927,512 | 7/1999 | Beffa . |
| 5,940,300 | 8/1999 | Ozaki . |
| 6,004,827 | 12/1999 | Ryan . |
| 6,060,328 | 5/2000 | En et al. . |
| 6,077,357 | 6/2000 | Rossman et al. . |

*Primary Examiner*—John F. Niebling
*Assistant Examiner*—Jonathan Hack
*Attorney, Agent, or Firm*—H. Donald Nelson

[57] ABSTRACT

A method of manufacturing a semiconductor wafer wherein each layer to be scanned is scanned in a scan tool after determination of whether the current recipe is contained in the scan tool. The recipe in the scan tool is compared to the current recipe stored in a server. If the recipe in the scan tool is not the current recipe the current recipe is loaded into the scan tool from the server. The recipes in the server are updated from associated scan tools.

4 Claims, 4 Drawing Sheets

SCAN TOOL RECIPE SERVER

BACKGROUND OF THE INVENTION

1. Field of the Invention

This invention relates generally to the operation of scan tools in a semiconductor manufacturing process. More specifically, this invention relates to the recipes used in scan tools, which allow specific scan tools to capture silicon-based defects. Even more specifically, this invention relates to a method of ensuring that the correct recipe is always being used in specific scan tools.

2. Discussion of the Related Art

In order to remain competitive, a semiconductor manufacturer must continuously increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of circuits per unit area on a semiconductor integrated circuit chip. Another part of reducing the cost of a semiconductor integrated circuit chip is to increase the yield. As is known in the semiconductor manufacturing art, the yield of chips (also know as die or dice) from each wafer is not 100% because of defects during the manufacturing process. The number of good die obtained from a wafer determines the yield. As can be appreciated, die that must be discarded because of a defect or defects increases the cost of the remaining usable die because the cost of processing the wafer must be amortized over the usable die.

A single semiconductor die requires numerous process steps such as oxidation, etching, metallization and wet chemical cleaning. Some of these process steps involve placing the wafer on which the semiconductor die are being manufactured into different tools during the manufacturing process. The optimization of each of these process steps requires an understanding of a variety of chemical reactions and physical processes in order to produce high performance, high yield circuits. The ability to rapidly identify and correctly classify the defects on a layer of a semiconductor chip is an invaluable aid to those involved in research and development, process, problem solving and failure analysis of integrated circuits.

In order to be able to quickly resolve process or equipment issues in the manufacture of semiconductor products, a great deal of time, effort and corporate resources have been and are being expended on the development of "recipes" that allow specific scan tools to capture silicon based defects. Present recipes are considered product/layer/tool specific, but with the advent of tool matching recipes of a particular tool type can be used across all tools of that type for the same product/layer with minor modifications. This allows recipe propagation to occur to all tools in a manufacturing environment with the recipes being copies (or propagated) to all tools of a same type.

The problem that has emerged is the problem of maintaining the current approved recipe for a certain product/layer on all tools, or ensuring that the correct recipe is always being used at any time on any tool. Whenever a recipe is either created or modified it needs to be propagated to the tools in question, requiring the recipe creator to go to each tool with a copy of the new or modified recipe and load it to the tool.

Therefore, what is needed is a recipe management system for multiple tools. The recipe management system needs to have the ability to communicate with the individual scan tools to ensure that the proper recipe is available immediately to all scan tools for any product/layer combination for which a recipe has been derived for that scan tool type. In addition, the recipe management system would have the ability to determine immediately if the correct recipe is loaded on the particular tool and if not the recipe management system would have the ability to immediately download the correct recipe to the scan tool.

SUMMARY OF THE INVENTION

According to the present invention, the foregoing and other objects and advantages are obtained by a method of manufacturing semiconductor wafers in which each layer is scanned by a scan tool after it is determined whether the scan tool contains the current recipe.

In one aspect of the invention, the recipe in the scan tool in which the semiconductor wafer is to be scanned is compared to the current recipe in a server in which current recipes for each layer and process is stored. If the recipe in the scan tool is not the current recipe, the current recipe is loaded into the scan tool from the server.

In another aspect of the invention, the recipe in the server is updated from associated scan tools.

The described method thus provides a method in which each layer that is to be scanned is scanned by a scan tool that contains the current recipe. The invention provides a method that ensures that all layers that are to be scanned are scanned in a facility or associated facilities are scanned using the most up-to-date scan tool recipe.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
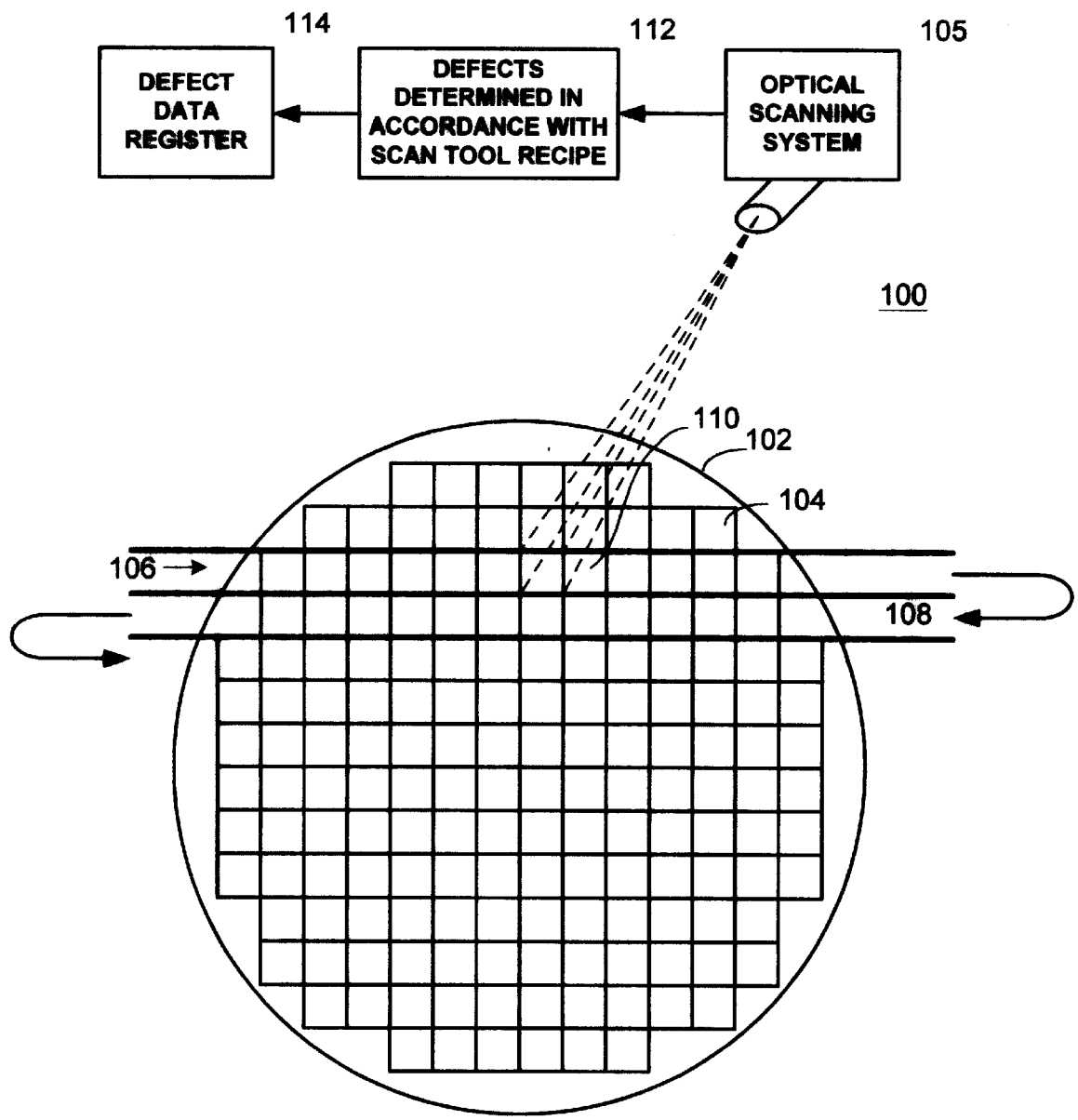
FIG. 1 is a diagrammatic schematic of a wafer scanning system and methodology.

FIG. 1 is a diagrammatic schematic of a wafer scanning system 100. A production wafer 102 is shown with die such as the one shown at 104. An optical scanning system 106 optically scans the die on the wafer 102 in swaths such as the swaths 106 and 108. The optical scanning system 105 scans the die 104 one at a time such as the die 110. Optical data from die 110 is transferred to a scan tool 112 that detects and classifies defects on the die 110 in accordance with a recipe for the particular layer being processed on the wafer 102 and for the particular scan tool being used. The classified defects are transferred to a defect data register 114 for further evaluation and use, for example, by the system operator to update the scan tool recipe for the particular layer and scan tool.

Figure 2:
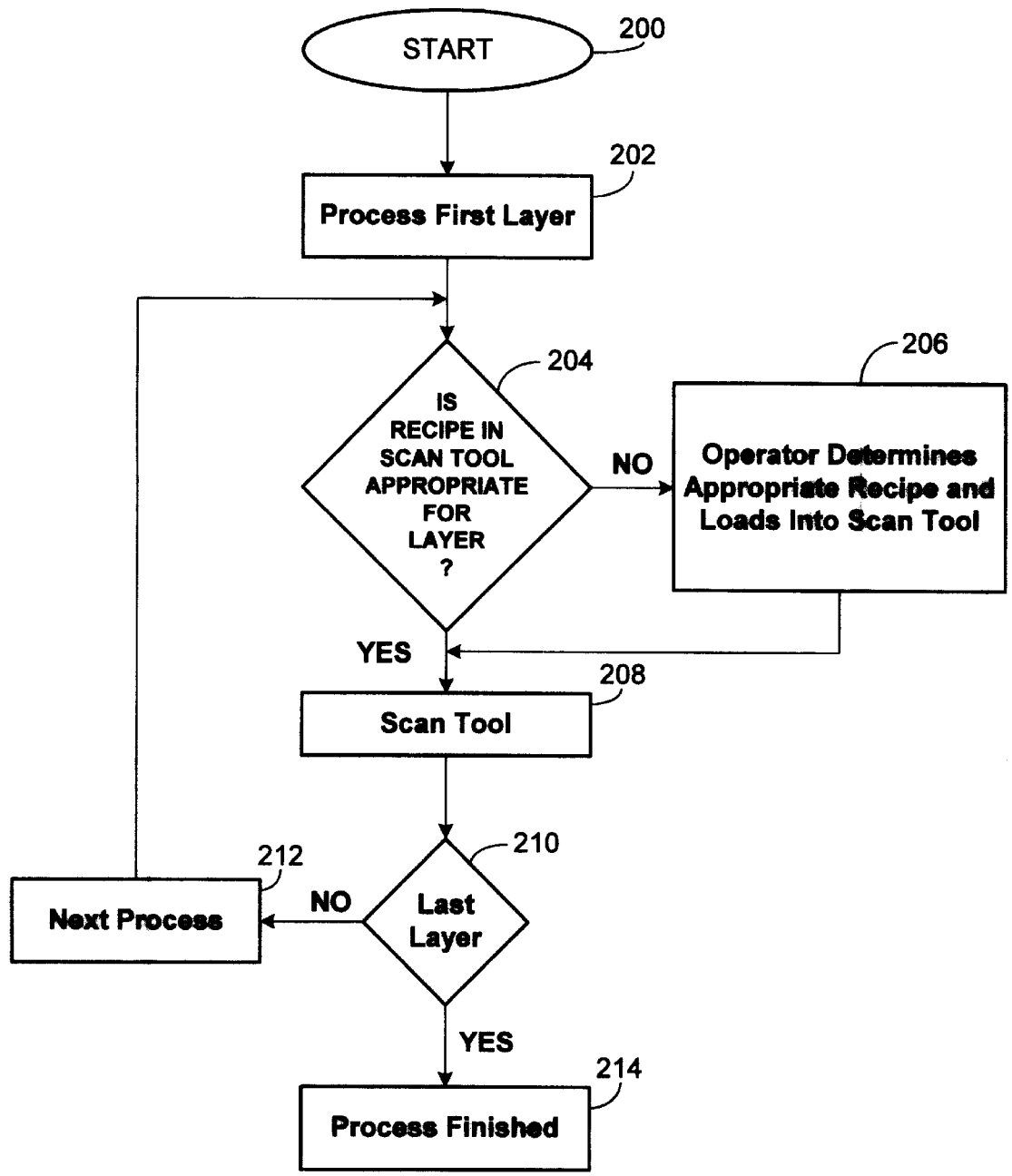
FIG. 2 is a flow diagram of a prior art wafer scanning system and methodology diagrammed in FIG. 1.

FIG. 2 is a flow diagram of a prior art wafer scanning methodology diagrammed in FIG. 1. The methodology starts at 200 by starting a wafer or wafers in a manufacturing process. It should be appreciated that wafers are typically processed in a manufacturing cassette that contains approximately 15 wafers. The discussion hereinafter will be directed to a single wafer but it should be understood that the process refers to all of the wafers. In addition, it should be understood that typically one or two of the wafers in the cassette are designated as wafers to be inspected (scanned) after selected layers have been processed. As is known in the semiconductor manufacturing art, some processes do not significantly cause defects to the wafer and therefore the wafer is typically not scanned after these types of processes. The first layer to be scanned is processed on the wafer, as indicated at 202. It is determined at 204 whether the appropriate scan tool recipe is in the scan tool that is to be used to scan the wafer. This determination is typically done by the system operator. If the appropriate scan tool recipe is not in the scan tool, the system operator then must determine what the appropriate scan tool recipe is and where it is located. This may involve inspecting all scan tools that are being used to scan the same layer in the same process. When a scan tool recipe is found that the system operator thinks is the "appropriate" scan tool recipe, the scan tool recipe is loaded into the scan tool, as indicated at 206. However, there is still not a 100% assurance that the located scan tool recipe is the most current and up-to-date recipe. The scan tool then scans the layer at 208. It is determined at 210 if the layer just processed and scanned is the last layer that is to be processed and scanned. If the layer just processed and scanned is not the last layer, the wafer is subjected to the next process at 212 and the process just described is repeated until it is determined at 210 that the last layer has been processed and scanned. When the last layer has been processed and scanned, the manufacturing process is finished as indicated at 214.

Figure 3:
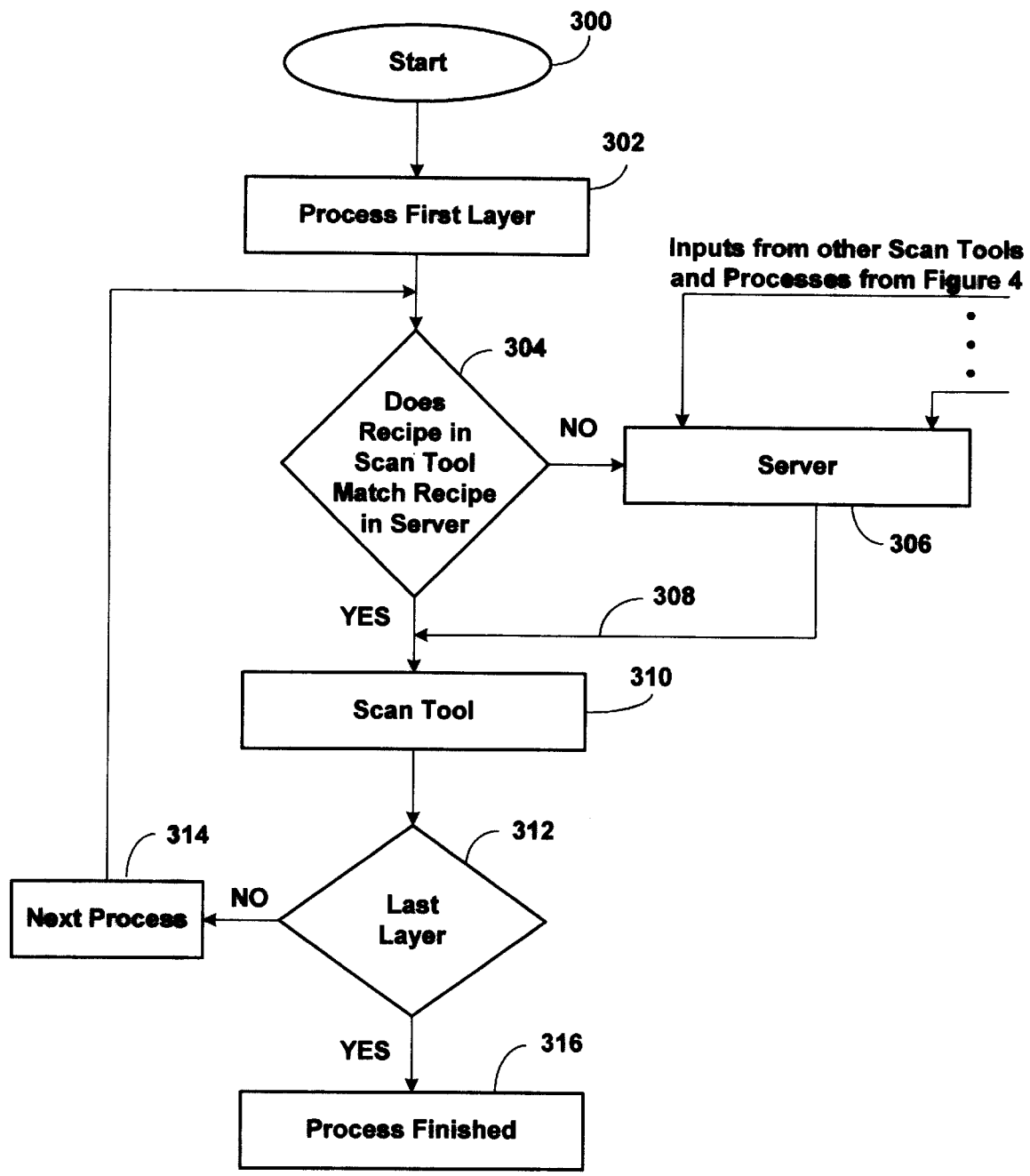
FIGS. 3 & 4 are two portions of a flow diagram of a wafer scanning system and methodology diagrammed in FIG. 1 in accordance with the present invention.
Figure 4:
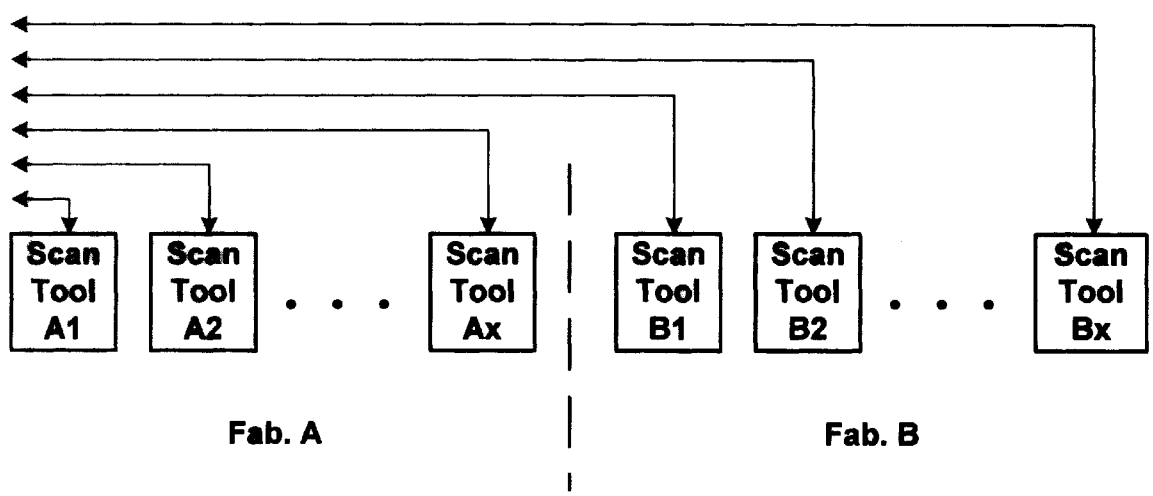

Referring to FIG. 3 there is shown a flow diagram of a wafer scanning methodology diagrammed in FIG. 1 in accordance with the present invention. The methodology starts at 300 by starting a wafer or wafers in a manufacturing process. Similar to the discussion of the prior art methodology discussed above in conjunction with the methodology illustrated in FIG. 2, wafers are typically processed in a manufacturing cassette that contains approximately 15 or more wafers. The discussion hereinafter will be directed to a single wafer but it should be understood that the process refers to all of the wafers. In addition, it should be understood that typically one or two of the wafers in the cassette are designated as wafers to be inspected (scanned) after selected layers have been processed. As is known in the semiconductor manufacturing art, some processes do not significantly cause defects to the wafer and therefore the wafer is typically not scanned after these types of processes. The first layer to be scanned is processed on the wafer, as indicated at 302. At 304, it is determined whether the recipe in the scan tool for the particular layer or particular scan tool is the most current recipe stored in the server 306. The server 306 has inputs as indicated from FIG. 4. The inputs are from multiple scan tools, such as scan tools $A_1$ through $A_x$ in fabrication plant (Fab.) A and from scan tools $B_1$ through $B_x$ in Fab. B. The scan tool recipes sent to the server 306 are continuously updated by system administrators or system operators with the latest information. If it is determined at 304 that the recipe in the scan tool that is to be used to scan the layer just completed is not the latest recipe, the server 306 automatically loads the current up-to-date scan tool recipe into the scan tool as indicated at 308. The scan tool then scans the layer at 310. It is determined at 312 if the layer just processed and scanned is the last layer that is to be processed and scanned. If the layer just processed and scanned is not the last layer, the wafer is subjected to the next process at 314 and the process just described is repeated until it is determined at 312 that the last layer has been processed and scanned. When the last layer has been processed and scanned, the manufacturing process is finished as indicated at 316.

The benefits of the invention include:
1. It allows a single standard to exist with a fabrication area, reducing error and misclassification;
2. It provides a central location for all scan recipes for ease of editing, updating, and general maintenance;
3. It is usable for other fabrication areas using the same process technology for tools of the same type within that facility; and
4. It provides complete recipe set at any tool reducing reliance on any particular tool in case of tool downtime.

In summary, the described method provides a method in which each layer that is to be scanned is scanned by a scan tool that contains the current recipe. The invention provides a method that ensures that all layers that are to be scanned are scanned in a facility or associated facilities are scanned using the most up-to-date scan tool recipe.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor wafer, the method comprising:

processing a first layer on a semiconductor wafer;

determining that a recipe in a scan tool in which the semiconductor wafer is to be scanned is the current recipe, wherein the step of determining that the recipe in the scan tool in which the semiconductor wafer is to be scanned is the current recipe is accomplished by comparing the recipe in the scan tool with a recipe in a server; and scanning the first layer of the semiconductor wafer using the current recipe.

2. The method of claim 1 further comprising the step of loading the current recipe from the server into the scan tool if the recipe in the scan tool is not the current recipe.

3. The method of claim 2 further comprising determining when a last layer on the semiconductor wafer has been processed.

4. The method of claim 3 further comprising updating the recipe in the server from information determined in associated scan tools.

* * * * *